United States Patent
Wang

(10) Patent No.: US 12,040,240 B2
(45) Date of Patent: Jul. 16, 2024

(54) SEMICONDUCTOR MANUFACTURING PROCESS CONTROL METHOD AND APPARATUS, DEVICE, AND STORAGE MEDIUM

(71) Applicant: CHANGXIN MEMORY TECHNOLOGIES, INC., Hefei (CN)

(72) Inventor: Yu-Han Wang, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 409 days.

(21) Appl. No.: 17/650,126

(22) Filed: Feb. 7, 2022

(65) Prior Publication Data

US 2023/0024659 A1 Jan. 26, 2023

Related U.S. Application Data

(63) Continuation of application No. PCT/CN2021/112218, filed on Aug. 12, 2021.

(30) Foreign Application Priority Data

Jul. 19, 2021 (CN) .......................... 202110812635.1

(51) Int. Cl.
*H01L 21/66* (2006.01)
*H01L 21/67* (2006.01)

(52) U.S. Cl.
CPC ........ *H01L 22/30* (2013.01); *H01L 21/67276* (2013.01)

(58) Field of Classification Search
CPC ......... H01L 22/00; H01L 22/20; H01L 22/30; H01L 21/00; H01L 21/67;
(Continued)

(56) References Cited

U.S. PATENT DOCUMENTS 7,236,848 B2 6/2007 Reeves et al.
8,688,256 B2 4/2014 Cheng et al.
(Continued)

FOREIGN PATENT DOCUMENTS

CN 102854848 A 1/2013
CN 102375413 B 6/2013
(Continued)

OTHER PUBLICATIONS

International Search Report PCT/CN2021/112218 mailed Apr. 7, 2022, 9 pages.

*Primary Examiner* — Hoai-An D. Nguyen

(74) *Attorney, Agent, or Firm* — Syncoda LLC; Feng Ma

(57) ABSTRACT

The present disclosure provides a semiconductor manufacturing process control method and apparatus, a device, and a storage medium. The method includes: analyzing wafer lot information and determining a current product lot of a current product; obtaining historical measurement data within a specified period; when determining that the historical measurement data does not include first measurement data of the current product lot, if determining, based on preset configuration information, that the historical measurement data includes second measurement data of a target product lot, determining a target regulatory data based on the preset configuration information and the second measurement data; and controlling a production parameter of the current product based on the target regulatory data.

19 Claims, 4 Drawing Sheets

(58) Field of Classification Search
CPC ......... H01L 21/67005; H01L 21/67242; H01L 21/67276; G05B 19/00; G05B 19/02; G05B 19/418; G05B 19/41875; G05B 2219/00; G05B 2219/30; G05B 2219/45; G05B 2219/45031; Y02P 90/00; Y02P 90/02
USPC .................................... 324/500, 537, 762.01
See application file for complete search history.

(56) References Cited

U.S. PATENT DOCUMENTS

| | | | | |
|---|---|---|---|---|
| 9,864,363 | B2 * | 1/2018 | Wu | .................... G05B 19/4183 |
| 2005/0004773 | A1 * | 1/2005 | Tai | ................... G05B 19/41875 |
| | | | | 702/84 |
| 2005/0114081 | A1 | 5/2005 | Fukui | |

FOREIGN PATENT DOCUMENTS

| | | | | |
|---|---|---|---|---|
| CN | 111180350 | | 5/2020 | |
| CN | 111209609 | | 5/2020 | |
| CN | 112071765 | | 12/2020 | |
| CN | 112541657 A * | | 3/2021 | ....... G06Q 10/06315 |
| CN | 112563152 | | 3/2021 | |
| JP | 3614838 B2 * | | 1/2005 | ............. H01L 21/66 |
| JP | 2006279072 A * | | 10/2006 | ....... H01L 21/67276 |
| JP | 2014099437 A * | | 5/2014 | ........... H01L 21/205 |
| KR | 20080068857 A * | | 7/2008 | ............. H01L 22/20 |
| TW | 544741 B | | 8/2003 | |
| TW | I600107 B * | | 9/2017 | ....... G05B 19/41865 |
| WO | WO-2004040632 A1 * | | 5/2004 | ........... F27B 17/0025 |

* cited by examiner

SEMICONDUCTOR MANUFACTURING PROCESS CONTROL METHOD AND APPARATUS, DEVICE, AND STORAGE MEDIUM

CROSS-REFERENCE TO RELATED APPLICATIONS

This is a continuation of International Application No. PCT/CN2021/112218, filed on Aug. 12, 2021, which claims the priority to Chinese Patent Application No. 202110812635.1, titled "SEMICONDUCTOR MANUFACTURING PROCESS CONTROL METHOD AND APPARATUS, DEVICE, AND STORAGE MEDIUM" and filed on Jul. 19, 2021. The entire contents of International Application No. PCT/CN2021/112218 and Chinese Patent Application No. 202110812635.1 are incorporated herein by reference.

TECHNICAL FIELD

The present disclosure relates to, but is not limited to, a semiconductor manufacturing process control method and apparatus, a device, and a storage medium.

BACKGROUND

Run-to-run control (R2R control for short), also referred to as lot-to-lot control, is a type of feedback control in the semiconductor manufacturing process. R2R (RtR) control is an optimized control method for batch processes. It updates the process models and adjusts the recipes based on feedback evaluation and analysis of historical lot information, thereby reducing product differences between different lots.

SUMMARY

An overview of the subject matter detailed in the present disclosure is provided below, which is not intended to limit the protection scope of the claims.

The present disclosure provides a semiconductor manufacturing process control method and apparatus, a device, and a storage medium.

A first aspect of the present disclosure provides a semiconductor manufacturing process control method, including:
analyzing wafer lot information and determining a current product lot of a current product;
obtaining historical measurement data within a specified period;
when determining that the historical measurement data does not include first measurement data of the current product lot, if determining, based on preset configuration information, that the historical measurement data includes second measurement data of a target product lot, determining a target regulatory data based on the preset configuration information and the second measurement data; and controlling production parameters of the current product based on the target regulatory data.

A second aspect of the present disclosure provides a semiconductor manufacturing process control apparatus, including:
one or more processors; and
a storage apparatus, configured to store one or more programs, wherein the one or more programs, when executed by the one or more processors, cause the one or more processors to execute operations of:
analyzing wafer lot information and determine a current product lot of a current product;
obtaining historical measurement data within a specified period, wherein
when determining the historical measurement data does not include first measurement data of the current product lot, if determining, based on preset configuration information, that the historical measurement data includes second measurement data of a target product lot, determine a target regulatory data based on the preset configuration information and the second measurement data; and
controlling production parameters of the current product based on the target regulatory data.

According to a third aspect of the embodiments of the present disclosure, a non-transitory computer-readable storage medium is provided. When an instruction in the non-transitory computer-readable storage medium is executed by a processor of a semiconductor production device, the semiconductor production device is enabled to perform the method as described in the first aspect.

Other aspects of the present disclosure are understandable upon reading and understanding the drawings and detailed description.

BRIEF DESCRIPTION OF THE DRAWINGS

The drawings incorporated into the specification and constituting part of the specification illustrate the embodiments of the present disclosure, and are used together with the description to explain the principles of the embodiments of the present disclosure. In these drawings, similar reference numerals are used to represent similar elements. The drawings in the following description are part rather than all of the embodiments of the present disclosure. Those skilled in the art may derive other drawings based on these drawings without creative efforts.

DETAILED DESCRIPTION

The technical solutions in the embodiments of the present disclosure are described below clearly and completely with reference to the drawings in the embodiments of the present disclosure. Apparently, the described embodiments are merely part rather than all of the embodiments of the present disclosure. All other embodiments obtained by those skilled in the art based on the embodiments of the present disclosure without creative efforts should fall within the protection scope of the present disclosure. It should be noted that the embodiments in the present disclosure and features in the embodiments may be combined with each other in a non-conflicting manner.

In the field of integrated circuits, as the key dimensions decrease, the feedback regulatory technology of R2R control (lot control) becomes more important. R2R control must use measurement data of a previous lot (or lots) of products to calculate a production parameter of a next lot of products. Because there are limited semiconductor production devices (such as measurement machines) and the quantity of measured products also has an impact on the production capacity, different products may be allocated in a certain proportion for measurement. In the R2R control process, sometimes, no measurement data of the previous lot (or lots) of products is available. Consequently, production needs to be suspended, and the engineer has to intervene in processing. As a result, the automation degree is poor, and the efficiency of the entire control process is seriously affected.

The present disclosure provides a semiconductor manufacturing process control method. In the method, in the semiconductor manufacturing process (such as R2R), when historical measurement data does not include first measurement data of a current product lot (that is, the historical measurement data does not include first measurement data of a product in the same product lot as a current product), target regulatory data may be determined based on second measurement data of another product, and then a production parameter of the current product may be controlled based on the target regulatory data. In this way, the intelligence of the entire control method is improved, and production capacity can be improved to a certain extent.

Figure 1:
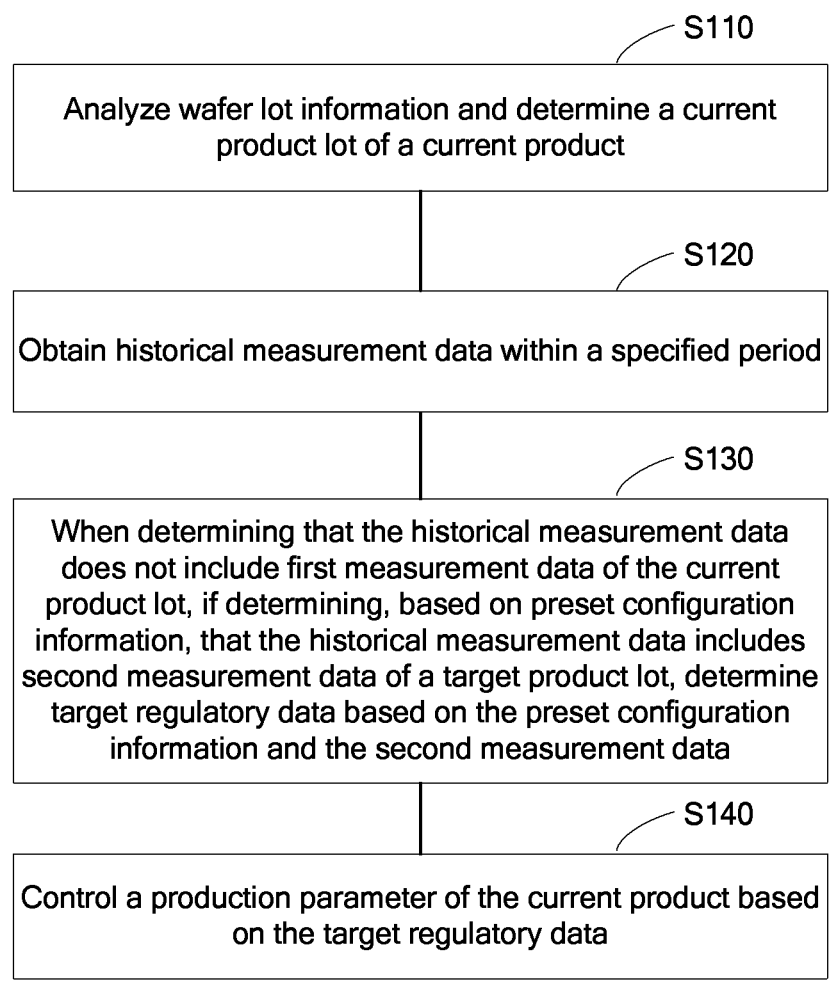
FIG. 1 is a flowchart of a semiconductor manufacturing process control method according to an exemplary embodiment.

An exemplary embodiment of the present disclosure provides a semiconductor manufacturing process control method. As shown in FIG. 1, the method may include:

S110: Analyze wafer lot information and determine a current product lot of a current product.

S120: Obtain historical measurement data within a specified period.

S130: When determining that the historical measurement data does not include first measurement data of the current product lot, if determining, based on preset configuration information, that the historical measurement data includes second measurement data of a target product lot, determine a target regulatory data based on the preset configuration information and the second measurement data.

S140: Control production parameters of the current product based on the target regulatory data.

In step S110, in wafer production processes, due to the existence of different wafer manufacturing plants, different wafer foundries, and different packaging and testing plants, although the design drawings, software, raw materials and processes are the same, there are generally differences in quality and performance of products produced by each lot of feed. Generally, the same lot of products have the same parameter, production process, assembly factory, welding process, and the like, which can ensure a high consistency degree among the wafers. It is generally considered that the products in the same lot are the same.

In this step, the wafer lot information may be analyzed and obtained, to determine lot information of the current product, which is recorded as the current product lot.

The wafer may be a semiconductor wafer with a basic semiconductor, a compound semiconductor, an alloy semiconductor, or any combination thereof. In addition, as the manufacturing process progresses, a complete or partial semiconductor component structure may have been formed on the wafer.

In step S120, the specified period may be a period (for example, duration) that has been specified before the semiconductor production device leaves the factory, or may be a period specified by the user later. During the use of the semiconductor production device, the user can modify the specified period.

In addition, it should be noted that the run-to run control is mainly the control among different lots of same units. If multiple wafers are processed in each lot, the multiple wafers are called a lot. In this case, a configuration form of the run-to run control is Lot-to-Lot (L2L). If a single wafer is processed in each lot, a configuration form of run-to run control is Wafer-to-Wafer (W2 W). Therefore, the above-mentioned cycle may be a cycle of producing one lot of wafers, or a cycle of producing one wafer. In addition, the specified period may be the previous cycle (T-1), the previous two cycles (T-2), or the previous three cycles (T-3) of the current cycle (T).

In this step, the historical measurement data may be measurement data stored during the use of the semiconductor production device currently in use, or may be measurement data downloaded from the network. When the historical measurement data is the measurement data downloaded from the network, the measurement data is measurement data that is stored during use and uploaded by a device in a same lot as the above-mentioned semiconductor production device.

The measurement data may include a measurement value of a film thickness of the wafer, a measurement value of an etching depth after etching, and so on.

In step S130, whether the historical measurement data includes the first measurement data of the current product lot is first determined. The first measurement data of the current product lot is measurement data of a product in the current product lot.

When it is determined that the historical measurement data includes the first measurement data of the current product lot, the target regulatory data is determined directly based on the first measurement data in the historical measurement data.

When it is determined that the historical measurement data does not include the first measurement data, whether the historical measurement data includes the second measurement data of the target product lot is determined based on the preset configuration information. The second measurement data of the target product lot is measurement data of a product in the target product lot.

If it is determined that the historical measurement data includes the second measurement data, the target regulatory data may be determined based on the preset configuration information and the second measurement data, to control the production parameter of the current product.

In step S140, the production parameter of the current product may be controlled based on the target regulatory data determined in step S130. That is, the production parameter used by the semiconductor production device to process the current product is determined based on the target regulatory data.

It should be noted that when it is determined that the historical measurement data does not include the first measurement data of the current product lot, if it is determined, based on the preset configuration information, that the historical measurement data does not include the second measurement data of the target product lot, the current processing process may be stopped.

In the method, when the historical measurement data does not include the first measurement data of the current product lot (that is, the historical measurement data does not include first measurement data of a product in the same product lot as the current product), the target regulatory data may be determined based on the second measurement data of another product, and then the production parameter of the current product may be controlled based on the target regulatory data. In this way, the intelligence of the entire control method is improved, and production capacity can be improved to a certain extent.

An exemplary embodiment of the present disclosure provides a semiconductor manufacturing process control method. In the method, in the preset configuration information, the current product lot may correspond to at least one reference product lot, and the at least one reference product lot may be prioritized.

For example, the current product lot corresponds to three reference product lots, that is, the preset configuration information includes three reference product lots and three corresponding priorities. Each reference product lot corresponds to one priority. A reference product lot L1 corresponds to a first level I, a reference product lot L2 corresponds to a second level II, and a reference product lot L3 corresponds to a third level III. The first level I is better than the second level II, and the second level II is better than the third level III.

For another example, the current product lot corresponds to only one reference product lot, that is, the preset configuration information includes one reference product lot and one corresponding priority. The reference product lot may be recorded as L1, and its corresponding priority may be recorded as a first level.

In the method, the determining, based on the preset configuration information, that the historical measurement data includes the second measurement data of the target product lot may include:

S210: Sequentially search for measurement data of reference product lot from the historical measurement data based on a priority of each the reference product lot in the at least one reference product lot.

S220: Determine a found measurement data of the reference product lot as the second measurement data of the target product lot.

In the method, sequentially search for the measurement data of reference product lot from the historical measurement data based on the priority of each the reference product lot in the at least one reference product lot in a descending order. The measurement data of the reference product lot is measurement data of a product in the reference product lot.

In the process of searching for the measurement data of the reference product lot, measurement data of a reference product lot with a highest priority is first searched for. If the measurement data of the reference product lot with the highest priority is found in the historical measurement data, the search is ended, and the measurement data of the reference product lot with the highest priority is directly determined as the second measurement data of the target product lot. That is, the reference product lot with the highest priority is directly determined as the target product lot, and the measurement data is determined as the second measurement data.

If the measurement data of the reference product lot with the highest priority is not found in the historical measurement data, the historical measurement data continues to be searched for measurement data of a reference product lot with a second highest priority. Until measurement data of one reference product lot is found, the measurement data of the found reference product lot is determined as the measurement data of the target product lot.

It should be noted that if measurement data of any reference product lot is not found in the historical measurement data, it indicates that it is determined, based on the preset configuration information, that the historical measurement data does not include the second measurement data of the target product lot. In this case, the current processing process may be stopped.

Example 1

In the preset configuration information, the current product lot corresponds to three reference product lots. A reference product lot L1 corresponds to a first level, a reference product lot L2 corresponds to a second level, and a reference product lot L3 corresponds to a third level. The first level is higher than the second level, and the second level is higher than the third level.

When the measurement data of the reference product lot is searched for, the historical measurement data is first searched for measurement data of the reference product lot L1 corresponding to the first level. If the measurement data of the reference product lot L1 is found in the historical measurement data, the reference product lot L1 is determined as the target product lot, and the found measurement data of the reference product lot L1 is determined as the second measurement data, to control the production parameter of the current product.

If the measurement data of the reference product lot L1 is not found in the historical measurement data, the historical measurement data continues to be searched for measurement data of the reference product lot L2 corresponding to the second level. If the measurement data of the reference product lot L2 is found in the historical measurement data, the reference product lot L2 is determined as the target product lot, and the found measurement data of the reference product lot L2 is determined as the second measurement data, to control the production parameter of the current product.

If the measurement data of the reference product lot L2 is not found in the historical measurement data, the historical measurement data continues to be searched for measurement data of the reference product lot L3 corresponding to the third level. If the measurement data of the reference product lot L3 is found in the historical measurement data, the reference product lot L3 is determined as the target product lot, and the found measurement data of the reference product lot L3 is determined as the second measurement data, to control the production parameter of the current product.

If the measurement data of the reference product lot L3 is not found in the historical measurement data, it is determined that the historical measurement data does not include the second measurement data of the target product lot, and the current processing process may be stopped.

In the method, the historical measurement data is sequentially searched for the second measurement data of the target product lot based on the priority of each the reference product lot in the at least one reference product lot, which avoids disordered search and improves the efficiency for determining the second measurement data. In this way, the efficiency of the semiconductor manufacturing process can be improved to a certain extent, and the production capacity can be improved.

It should be noted that in the method, alternatively, the historical measurement data may be first searched for measurement data of all of the at least one reference product lot based on the priority of each the reference product lot in the at least one reference product lot until the search is completed for all of the at least one reference product lot.

If measurement data of any reference product lot is not found in the historical measurement data, it is determined that the historical measurement data does not include the second measurement data of the target product lot, and the current processing process may be stopped.

If measurement data of a reference product lot is found in the historical measurement data, the found reference product lot may be directly determined as the target product lot, and the found measurement data may be determined as the second measurement data.

If measurement data of more than one reference product lot is found in the historical measurement data, a reference product lot with a highest priority is determined as the target product lot, and found measurement data of the target product lot is determined as the second measurement data.

In the method, the historical measurement data is sequentially searched for the second measurement data of the target product lot based on the priority of each the reference product lot in the at least one reference product lot, which improves the efficiency for determining the second measurement data. In this way, the efficiency of the semiconductor manufacturing process can be improved to a certain extent, and the production capacity can be improved.

An exemplary embodiment of the present disclosure provides a semiconductor manufacturing process control method. In the method, the determining target regulatory data based on the preset configuration information and the second measurement data may include:

S310: Determine the reference regulatory data based on the second measurement data.
S320: Determine the offset data corresponding to the target product lot in the preset configuration information as target offset data.
S330: Determine the target regulatory data based on the target offset data and the reference regulatory data.

In step S310, data processing is performed on the second measurement data to obtain a reference regulatory parameter for controlling production of a reference product.

In step S320, in the preset configuration information, each the reference product lot in the at least one reference product lot may correspond to one piece of offset data, and the offset data may represent a conversion relationship between reference regulatory data of the corresponding reference product lot and the target regulatory data.

That is, the offset data may represent offset between the reference regulatory data of the corresponding reference product lot and the target regulatory data. The reference regulatory data and the target regulatory data each include data of multiple production parameters. Therefore, the offset data may include offset values of the multiple production parameters.

After the reference product lot used as the target product lot is determined, in this step, the preset configuration information may be searched for offset data corresponding to the reference product lot (that is, the reference product lot used as the target product lot), and then the found offset data is determined as the target offset data.

Example 1

In the preset configuration information, the current product lot corresponds to three reference product lots. A reference product lot L1 corresponds to offset data P1, a reference product lot L2 corresponds to offset data P2, and a reference product lot L3 corresponds to offset data P3.

When the reference product lot L1 is determined as the target product lot, the offset data P1 corresponding to the reference product lot L1 is determined as the target offset data.

Example 2

In the preset configuration information, the current product lot corresponds to one reference product lot, which is recorded as a reference product lot L1 and corresponds to offset data P1. When the reference product lot L1 is determined as the target product lot, the offset data P1 corresponding to the reference product lot L1 is determined as the target offset data.

In step S330, the target offset data may be used to adjust the reference regulatory data, and then the target regulatory data is determined.

For example, if the reference regulatory data is a regulatory value 4.5 and the target offset data is an offset+1.6, the target regulatory data is a regulatory value 4.5+1.6=6.1.

For another example, if the reference regulatory data is a regulatory value 2.3 and the target offset data is an offset −1.2, the target regulatory data is a regulatory value 2.3−1.3=1.1.

In the method, in the preset configuration information, each the reference product lot in the at least one reference product lot corresponds to one piece of offset data, and the offset data is used to represent the conversion relationship between the reference regulatory data of the reference product lot and the target regulatory data of the current product lot. In this way, the target regulatory data of the current product lot (that is, the target regulatory data of the current product) may be accurately determined based on the measurement data of the reference product lot, and the production parameter of the current product may be controlled, to ensure normal production of the current product and improve the production efficiency and production capacity.

An exemplary embodiment of the present disclosure provides a semiconductor manufacturing process control method. In the method, in the preset configuration information, each the reference product lot in the at least one reference product lot may correspond to at least one sensor life cycle range, each sensor life cycle range may correspond to one piece of offset data, and the offset data represents a conversion relationship between reference regulatory data of the corresponding reference product lot and the target regulatory data.

That is, in the method, each reference product lot may correspond to only one piece of reference regulatory data. In the preset configuration information, each the at least one reference product lot in the at least one product lot may correspond to at least one sensor life cycle range, and each sensor life cycle range may correspond to one piece of offset data, that is, each reference product lot may correspond to at least one piece of offset data.

In the method, the determining target regulatory data based on the preset configuration information and the second measurement data may include:

S410: Obtain a current sensor life cycle of a semiconductor production device.
S420: Determine a sensor life cycle range to which the current sensor life cycle belongs as a current life cycle range.

S430: Determine an offset data corresponding to the target product lot and the current life cycle range in the preset configuration information as target offset data.

S440: Determine a reference regulatory data based on the second measurement data.

S450: Determine the target regulatory data based on the target offset data and the reference regulatory data.

In step S410, the semiconductor production device may include multiple sensors for measuring or performing other tests on the produced products. As the sensors are used, the detection results are affected to a certain extent.

The current sensor life cycle may refer to current measurement times of the sensor. When the sensor performs detection once, one life cycle is recorded, which also means that the semiconductor production device generates the measurement data once.

In the step, the measurement times in the measurement records in the semiconductor production device may be directly obtained and used as the current sensor life cycle.

In step S420, the preset configuration information is searched for the sensor life cycle range to which the current sensor life cycle belongs, and the found sensor life cycle range is used as the current life cycle range.

In step S430, the preset configuration information is searched for the offset data corresponding to the current life cycle range and the target product lot, and the found offset data is determined as the target offset data.

Example 1

In the preset configuration information, the current product lot corresponds to three reference product lots, which are respectively recorded as a reference product lot L1, a reference product lot L2, and a reference product lot L3. Each reference product lot corresponds to two sensor life cycle ranges, which are respectively recorded as a sensor life cycle range C1 and a sensor life cycle range C2.

For the reference product lot L1, the sensor life cycle range C1 corresponds to offset data P1-1, and the sensor life cycle range C2 corresponds to offset data P1-2. For the reference product lot L2, the sensor life cycle range C1 corresponds to offset data P2-1, and the sensor life cycle range C2 corresponds to offset data P2-2. For the reference product lot L3, the sensor life cycle range C1 corresponds to offset data P3-1, and the sensor life cycle range C2 corresponds to offset data P3-2.

The current sensor life cycle belongs to the sensor life cycle range C1, and the reference product lot L1 is the target product lot. In this case, the offset data P1-1 in the preset configuration information may be determined as the target offset data.

In step S440, data processing is performed on the second measurement data to obtain a reference regulatory parameter for controlling production of a reference product. For details, refer to step S310 in the foregoing exemplary embodiment.

In step S450, the target offset data may be used to adjust the reference regulatory data, and then the target regulatory data may be determined. For details, refer to step S330 in the foregoing exemplary embodiment.

In the method, some offset data may be affected by the sensor life cycle. For this part of offset data, in the preset configuration information, each the reference product lot in the at least one product lot corresponds to at least one sensor life cycle range, each sensor life cycle range corresponds to one piece of offset data. In this way, the target regulatory data of the current product lot (that is, the target regulatory data of the current product) may be accurately determined based on the measurement data of the reference product lot, such that the production parameter of the current product may be controlled, to ensure normal production of the current product and improve production efficiency and production capacity.

It should be noted that when the sensor life cycle range does not affect the offset data, only one sensor life cycle range including all sensor life cycles may be set in the preset configuration information, or no sensor life cycle range is set.

An exemplary embodiment of the present disclosure provides a semiconductor manufacturing process control method. In the method, the obtaining historical measurement data within a specified period may include:

S510: Determine a current regulatory layer of the current product.

S520: Obtain the historical measurement data within a specified period corresponding to the current regulatory layer.

In step S510, the current regulatory layer is a semiconductor layer that needs to be processed in the current product.

The semiconductor production device processes different regulatory layers and requires different production parameters. Therefore, the current regulatory layer needs to be determined first.

The current regulatory layer may be determined by analyzing the wafer lot information. To be specific, when the wafer lot information is analyzed, not only the current product lot of the current product can be determined, but the current regulatory layer of the current product can also be determined.

In step S520, when the current regulatory layer is determined, the historical measurement data within the specified period corresponding to the current regulatory layer is obtained. That is, the measurement data (including measurement data of a product in the current product lot and measurement data of other products) when the current regulatory layer is processed can be found in the measurement data within the specified period.

In the method, when it is determined that the historical measurement data does not include the first measurement data of the current product lot, if it is determined, based on the preset configuration information, that the historical measurement data includes the second measurement data of the target product lot, the target regulatory data may be determined based on the preset configuration information and the second measurement data, and then the production parameter of the current regulatory layer of the current product is controlled based on the target regulatory data, to process the current regulatory layer of the current product. If it is determined, based on the preset configuration information, that the historical measurement data does not include the second measurement data of the target product lot, processing of the current regulatory layer of the current product is prohibited.

In the method, the historical measurement data of the current regulatory layer is obtained in a targeted manner, which can reduce the data processing amount to a certain extent, improve the data processing efficiency, and thereby improve the production efficiency.

An exemplary embodiment of the present disclosure provides a semiconductor manufacturing process control method. In the method, in the preset configuration information, each the reference product lot in the at least one reference product lot is determined by the following method:

S610: Obtain historical regulatory data of the current regulatory layer.

S620: Determine the priority of each the reference product lot in the at least one reference product lot based on a regulatory data volume of each the reference product lot in the at least one reference product lot in the historical regulatory data.

In step S610, there is no necessary correlation between the historical regulatory data and the historical measurement data, and methods for obtaining the two may be the same or different.

In the step, the historical regulatory data of the current regulatory layer may be obtained from the regulatory record in the semiconductor production device, or historical regulatory data when a semiconductor production device of a same type produces the current regulatory layer may be downloaded from the network.

In step S620, a reference product lot corresponding to regulatory data with a larger amount may be determined as a higher priority.

A larger amount of the regulatory data indicates higher reliability of target regulatory data determined based on the regulatory data. Therefore, the reliability of the determined target regulatory data may be improved if the reference product lot corresponding to the regulatory data with a larger amount is determined as the higher priority.

Example 1

The historical regulatory data of the current regulatory layer includes regulatory data of three reference product lots. A reference product lot L1 corresponds to first regulatory data, a reference product lot L2 corresponds to second regulatory data, and a reference product lot L3 corresponds to third regulatory data. A regulatory data volume of the first regulatory data is a, a second regulatory data volume of the second regulatory data is b, and a regulatory data volume of the third regulatory data is c, where a is greater than b, and b is greater than c.

The three reference product lots are set in the preset configuration information. A priority of the reference product lot L1 is set to a first level, a priority of the reference product lot L2 is set to a second level, and a priority of the reference product lot L3 is set to a third level, where the first level is higher than the second level, and the second level is higher than the third level.

In the method, the priority of each reference product lot in the preset configuration information is determined based on the regulatory data volume, and the reference product lot corresponding to the regulatory data with a larger amount may be set to a higher priority. Thereby, the target regulatory data can be determined more reliably, more suitable production parameters can be set, and the product yield can be improved.

An exemplary embodiment of the present disclosure provides a semiconductor manufacturing process control method. In the method, the historical regulatory data may include multiple first sub-regulatory data of the current product lot, and multiple second sub-regulatory data of each the reference product lot in the at least one reference product lot.

The method may further include:
determining, in a specified manner based on the multiple first sub-regulatory data and the multiple second sub-regulatory data, offset data corresponding to each the reference product lot in the at least one reference product lot.

It should be noted that a larger data volume of the first sub-regulatory data and the second sub-regulatory data indicates a higher reliability of the offset data obtained based on the sub-regulatory data. Therefore, in the method, the first sub-regulatory data and the second sub-regulatory data are obtained as much as possible, that is, the historical regulatory data is obtained as much as possible. For example, the historical regulatory data of the current regulatory layer is obtained from the regulatory record in the semiconductor production device currently in use, and the historical regulatory data when a semiconductor production device of a same type produces the current regulatory layer is also downloaded from the network, to improve the amount of the historical regulatory data, thereby increasing the reliability of the determined offset data.

The determining, in a specified manner based on the multiple first sub-regulatory data and the multiple second sub-regulatory data, offset data corresponding to each the reference product lot in the at least one reference product lot may include:

S610: Determine a sub-offset data corresponding to each sensor life cycles in the multiple sensor life cycles.

S620: Determine a mode in multiple sub-offset data corresponding to the multiple sensor life cycles as the offset data corresponding to each the reference product lot in the at least one reference product lot.

In step S610, the multiple first sub-regulatory data may be first sub-regulatory data corresponding to multiple sensor life cycles within a specified life cycle range, and the multiple second sub-regulatory data may be second sub-regulatory data corresponding to the multiple sensor life cycles. The multiple first sub-regulatory data, the multiple second sub-regulatory data and the multiple sensor life cycles are in a one-to-one correspondence.

Example 1

If the life cycle range is set to 1-3, the historical regulatory data includes first sub-regulatory data and second sub-regulatory data corresponding to a sensor life cycle 1, first sub-regulatory data and second sub-regulatory data corresponding to a sensor life cycle 2, and first sub-regulatory data and second sub-regulatory data corresponding to a sensor life cycle 3.

In addition, in this step, the sub-offset data represents a conversion relationship between the first sub-regulatory data and the second sub-regulatory data corresponding to each sensor life cycle.

Example 2

If the life cycle range is set to 1-3, sub-offset data corresponding to a sensor life cycle 1 is recorded as P1, sub-offset data corresponding to a sensor life cycle 2 is recorded as P2, and sub-offset corresponding to a sensor life cycle 3 is recorded as P3.

The sub-offset data P1 represents a conversion relationship between first sub-regulatory data and second sub-regulatory data corresponding to the sensor life cycle 1. The sub-offset data P2 represents a conversion relationship between first sub-regulatory data and second sub-regulatory data corresponding to the sensor life cycle 2. The sub-offset data P3 represents a conversion relationship between first sub-regulatory data and second sub-regulatory data corresponding to the sensor life cycle 3.

In step S620, the mode refers to a value that has an obvious central tendency in the statistical distribution, and represents a general level of the data. The mode can generally be understood as a number that occurs most frequently in a data set.

For example, in multiple sub-offset data corresponding to multiple sensor life cycles of a reference product lot C1, if sub-offset data with the most occurrences is P1, the sub-offset data P1 is determined as the offset data corresponding to the reference product lot C1.

In the method, the statistical method of mode is used to determine the offset data of each reference product lot, which can better reflect the conversion relationship between the regulatory data of the reference product lot and the regulatory data of the current product lot, such that the target regulatory data can be determined more accurately, and more reliable production parameter can be determined, thereby improving the production efficiency and production capacity.

It should be noted that, in addition to determining the offset data of the reference product lot in the specified method by using the mode, the offset data of the reference product lot may alternatively be determined through other methods.

For example, an average value of the sub-offset data corresponding to the multiple sensor life cycles within the specified life cycle range of the reference product lot may be determined as the offset data of the reference product lot within the specified life cycle range.

For another example, because a linear relationship between regulatory data and a sensor life cycle is similar within a specified life cycle range of each product lot, a linear function relationship between the regulatory data and the sensor life cycle within the specified life cycle range of the reference product lot may be first determined, for example, $y=ax+b$; then a linear function relationship between regulatory data and a sensor life cycle within a specified life cycle range of the current product lot is determined, for example, $y=ax+c$; and then the offset data of the specified life cycle range of the reference product lot is determined to be $c-b$ according to the two linear function relationships.

Figure 2:
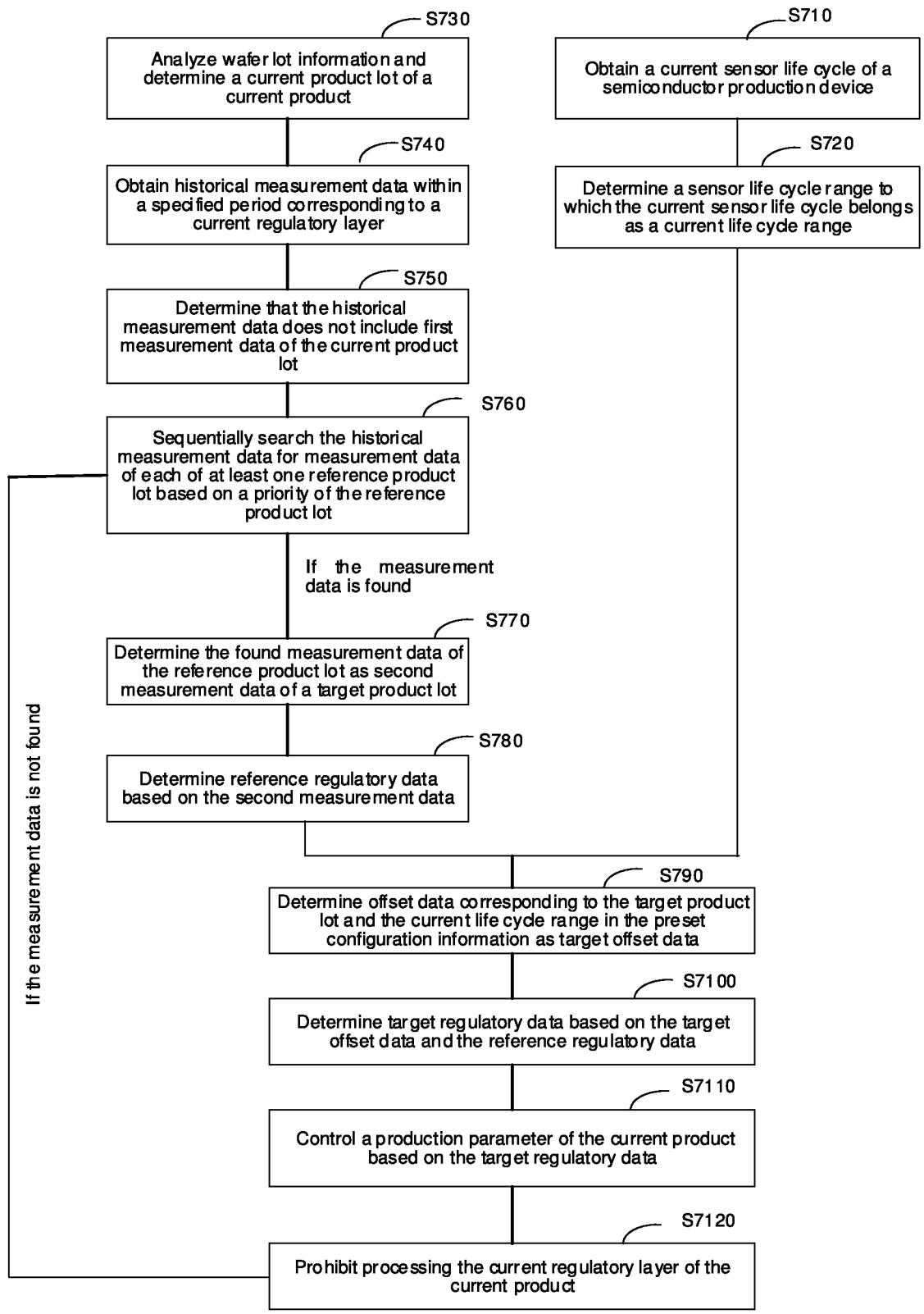
FIG. 2 is a flowchart of a semiconductor manufacturing process control method according to an exemplary embodiment.

An exemplary embodiment of the present disclosure provides a semiconductor manufacturing process control method. As shown in FIG. 2, the method may include:

S710: Obtain a current sensor life cycle of a semiconductor production device.

S720: Determine a sensor life cycle range to which the current sensor life cycle belongs as a current life cycle range.

S730: Analyze wafer lot information and determine a current product lot of a current product and a current regulatory layer.

S740: Obtain historical measurement data within a specified period corresponding to the current regulatory layer.

S750: Determine that the historical measurement data does not include first measurement data of the current product lot.

S760: Sequentially search for measurement data of reference product lot from the historical measurement data based on a priority of each the reference product lot in the at least one reference product lot; and if the measurement data is found, go to step S770; otherwise, go to step S7120.

S770: Determine the found measurement data of the reference product lot as second measurement data of a target product lot.

S780: Determine reference regulatory data based on the second measurement data.

S790: Determine offset data corresponding to the target product lot and the current life cycle range in the preset configuration information as target offset data.

S7100: Determine target regulatory data based on the target offset data and the reference regulatory data.

S7110: Control a production parameter of the current product based on the target regulatory data.

S7120: Prohibit processing the current regulatory layer of the current product.

In the method, in the process of performing steps S710 and S720, steps S730 to S780 may be performed at the same time. Moreover, in the method, the preset configuration information may be obtained by the computer processing and analyzing corresponding data through a preset algorithm, or may be determined by an engineer analyzing the corresponding data.

In addition, it should be noted that in the method, if it is determined that the historical measurement data includes the first measurement data of the current product lot, the target regulatory data is directly determined based on the first measurement data, and then the production parameter is controlled.

Example 1

| Offset data table of a regulatory layer A | | | | |
|---|---|---|---|---|
| Current | Reference product lot | | | Data |
| product lot | L1 | L2 | L3 | volume |
| L1 | 0 | +1.16 | +2.5 | 523 |
| L1 | −1.16 | 0 | +1.33 | 427 |
| L1 | −2.5 | −1.33 | 0 | 335 |

| Offset data table of a regulatory layer B | | | | | |
|---|---|---|---|---|---|
| | Sensor life cycle range | | | | |
| | 0-225 | 226-500 | | | |
| Current | Reference product lot | | | | Data |
| product lot | L1, L2, L3 | L1 | L2 | L3 | volume |
| L1 | 0 | 0 | −0.76 | −1.25 | 434 |
| L1 | 0 | +0.76 | 0 | −0.78 | 529 |
| L1 | 0 | +1.25 | +0.32 | 0 | 363 |

| Preset configuration information table | | | | | | |
|---|---|---|---|---|---|---|
| Regulatory layer | Current product lot | Reference product lot | Priority | Sensor (L) | Sensor (UP) | Offset data |
| A | L1 | L2 | I | NA | NA | 1.16 |
| A | L1 | L3 | II | NA | NA | 2.5 |
| A | L2 | L1 | I | NA | NA | −1.16 |
| A | L2 | L3 | II | NA | NA | 1.33 |
| B | L1 | L2 | I | 0 | 225 | 0 |
| B | L1 | L3 | II | 0 | 225 | 0 |
| B | L1 | L2 | I | 226 | 500 | −0.76 |
| B | L1 | L3 | II | 226 | 500 | −1.25 |
| B | L2 | L1 | I | 0 | 225 | 0 |
| B | L2 | L3 | II | 0 | 225 | 0 |

-continued

Preset configuration information table

| Regulatory layer | Current product lot | Reference product lot | Priority | Sensor (L) | Sensor (UP) | Offset data |
|---|---|---|---|---|---|---|
| B | L2 | L1 | I | 226 | 500 | 0.76 |
| B | L2 | L3 | II | 226 | 500 | −0.78 |

Figure 2A:
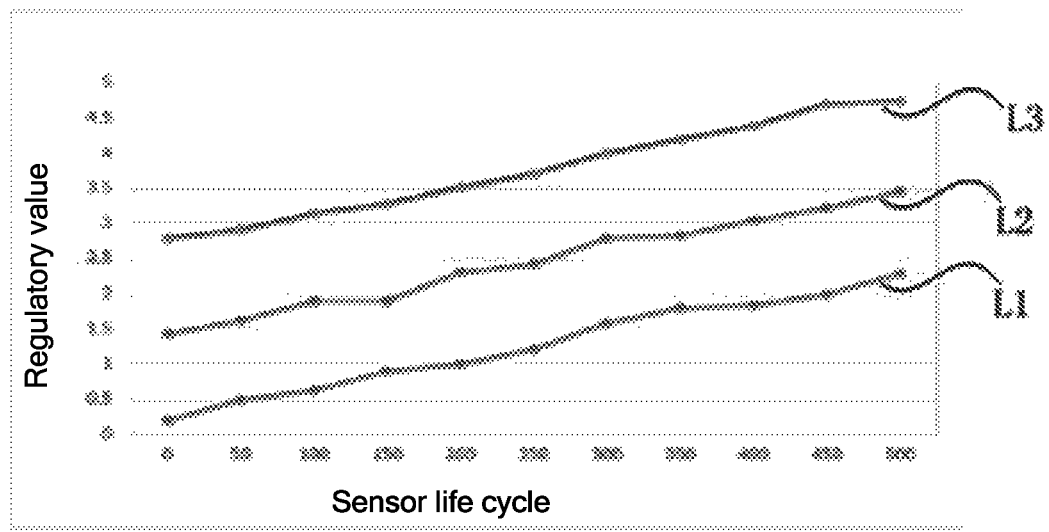
FIG. 2A is a line chart showing a relationship between regulatory data corresponding to a regulatory layer A and a sensor life cycle according to an exemplary embodiment.
Figure 2B:
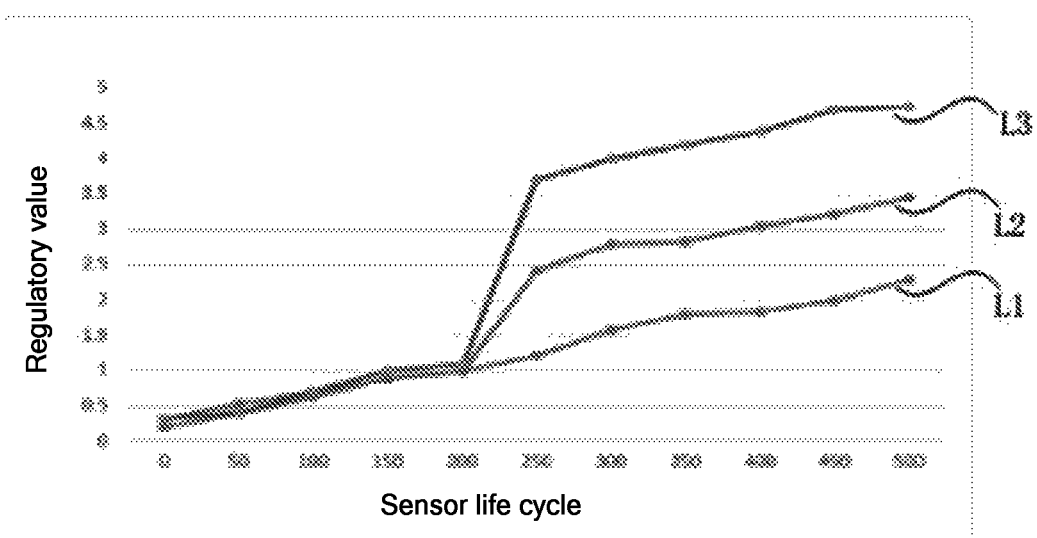
FIG. 2B is a line chart showing a relationship between regulatory data corresponding to a regulatory layer B and a sensor life cycle according to an exemplary embodiment.

Referring to FIG. 2, FIG. 2A and FIG. 2B, the historical regulatory data is processed to determine a line chart showing a relationship between regulatory data (such as regulatory values) of three product lots and a sensor life cycle. FIG. 2A is a line chart corresponding to a regulatory layer A, and FIG. 2B is a line chart corresponding to a regulatory layer B.

For the regulatory layer A, a difference between regulatory data of any two product lots is not affected by the sensor life cycle, that is, the offset data that represents a conversion relationship between regulatory data of any two product lots is not affected by the sensor life cycle. Therefore, a table of offset data between any two product lots of the regulatory layer A may be determined by using the mode, which is recorded as an offset data table of the regulatory layer A.

For the regulatory layer B, a difference between regulatory data of any two product lots is affected by the sensor life cycle, that is, the offset data that represents a conversion relationship between regulatory data of any two product lots is affected by the sensor life cycle. Therefore, a table of offset data between any two product lots of the regulatory layer B may be determined by using the mode, which is recorded as an offset data table of the regulatory layer B.

Preset configuration information determined based on the offset data table of the regulatory layer A and the offset data table of the regulatory layer B is the preset configuration information table.

The sensor (L) represents a minimum value of the sensor life cycle range, and the sensor (UP) represents a maximum value of the sensor life cycle range. NA may also be recorded as N/A (Not Available), which may be understood as unnecessary, that is, there is no corresponding value. NA is mainly used to make the above tables look more uniform. The three product lots are recorded as L1, L2, and L3 respectively. The two regulatory layers are recorded as A and B respectively. The priorities of the two levels are recorded as I and II respectively.

It can be learned from the foregoing tables that the offset data of the regulatory layer A is not affected by the sensor life cycle range. When the current product is L1, the current regulatory layer is A, and the target product lot is L2, target offset data corresponding to any sensor life cycle is 1.16. When the current product is L2, the current regulatory layer is A, and the target product lot is L3, target offset data corresponding to any sensor life cycle is 1.33.

The offset data of the regulatory layer B is different in the sensor life cycle ranges of 0-225 and 226-500. When the current product is L1, the current regulatory layer is B, the target product lot is L2, and the sensor life cycle range is 0-225, all the target offset data is 0. When the current product is L1, the current regulatory layer is B, the target product lot is L2, and the sensor life cycle range is 226-500, all the target offset data is −0.76. When the current product is L2, the current regulatory layer is B, the target product lot is L3, and the sensor life cycle range is 0-225, all the target offset data is 0. When the current product is L2, the current regulatory layer is B, the target product lot is L3, and the sensor life cycle range is 226-500, all the target offset data is −0.78.

In the method, in the semiconductor manufacturing process (such as R2R), when the historical measurement data does not include the first measurement data of the current product lot (that is, the historical measurement data does not include first measurement data of a product in the same product lot as the current product), the target regulatory data may be determined based on second measurement data of another product, and then the production parameter of the current product may be controlled based on the target regulatory data. In this way, the intelligence of the entire control method is improved, and production capacity can be improved to a certain extent.

It should be noted that in the method, the amount of historical regulatory data that can be obtained gradually increases with the passage of time. Therefore, new historical regulatory data can be obtained in real time, and the updated historical regulatory data can be used to determine new preset configuration information. Certainly, a preset configuration information update cycle may alternatively be specified. For example, new historical regulatory data is re-obtained at an interval of specified duration (for example, one week or one month), and new preset configuration information is re-determined based on the updated historical regulatory data.

In the method, the preset configuration information is updated in real time or periodically, such that an appropriate production parameter can be determined, to further improve the production efficiency and the production capacity.

Figure 3:
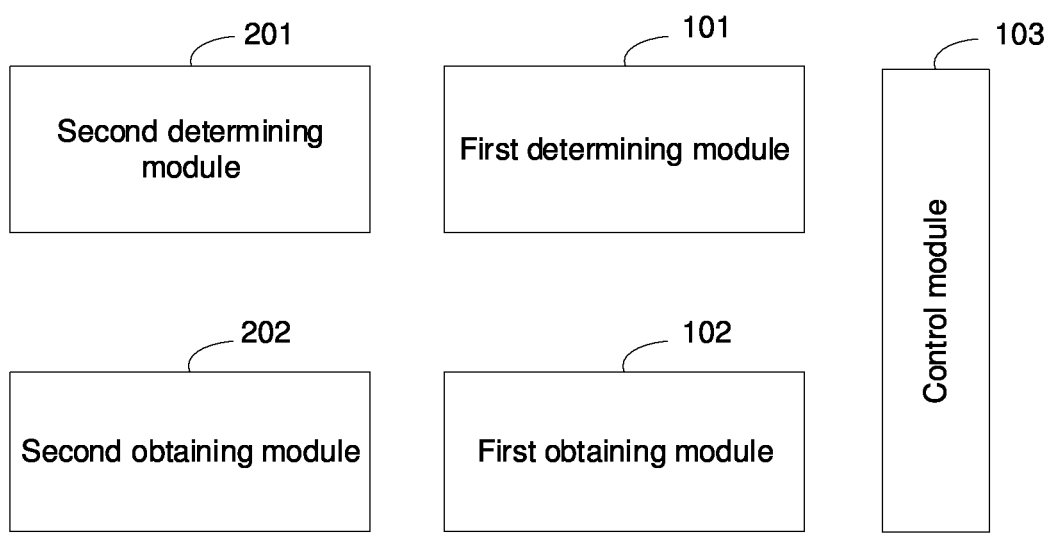
FIG. 3 is a block diagram of a semiconductor manufacturing process control apparatus according to an exemplary embodiment.

An exemplary embodiment of the present disclosure provides a semiconductor manufacturing process control apparatus. The apparatus is configured to implement the method described above. As shown in FIG. 3, the apparatus may include a first determining module 101, a first obtaining module 102, and a control module 103. When the apparatus implements the foregoing method, the first determining module 101 is configured to analyze wafer lot information and determine a current product lot of a current product;

the first obtaining module 102 is configured to obtain historical measurement data within a specified period;

the first determining module 101 is further configured to: when determining that the historical measurement data does not include first measurement data of the current product lot, if determining, based on preset configuration information, that the historical measurement data includes second measurement data of a target product lot, determine target regulatory data based on the preset configuration information and the second measurement data; and the control module 103 is configured to control a production parameter of the current product based on the target regulatory data.

An exemplary embodiment of the present disclosure provides a semiconductor manufacturing process control apparatus. Referring to FIG. 3, in the apparatus, in the preset configuration information, the current product lot corresponds to at least one reference product lot, and the first determining module 101 is further configured to:

sequentially search for measurement data of reference product lot from the historical measurement data based on a priority of each the reference product lot in the at least one reference product lot; and determine the found measurement data of the reference product lot as second measurement data of a target product lot.

An exemplary embodiment of the present disclosure provides a semiconductor manufacturing process control apparatus. As shown in FIG. 3, in the apparatus, when each the reference product lot in the at least one product lot corresponds to one offset data, the offset data represents a conversion relationship between reference regulatory data of the corresponding reference product lot and target regulatory data.

The first determining module 101 is further configured to:
determine reference regulatory data based on the second measurement data;
determine offset data corresponding to the target product lot in the preset configuration information as target offset data; and
determine the target regulatory data based on the target offset data and the reference regulatory data.

An exemplary embodiment of the present disclosure provides a semiconductor manufacturing process control apparatus. Referring to FIG. 3, in the apparatus, when each the reference product lot in the at least one product lot corresponds to at least one sensor life cycle range, and each sensor life cycle range corresponds to one piece of offset data, the offset data represents a conversion relationship between reference regulatory data of the corresponding reference product lot and the target regulatory data.

The first obtaining module 102 is further configured to obtain a current sensor life cycle of a sensor in a semiconductor production device.

The first determining module 101 is further configured to:
determine a sensor life cycle range to which the current sensor life cycle belongs as a current life cycle range;
determine offset data corresponding to the target product lot and the current life cycle range in the preset configuration information as target offset data;
determine reference regulatory data based on the second measurement data; and
determine the target regulatory data based on the target offset data and the reference regulatory data.

An exemplary embodiment of the present disclosure provides a semiconductor manufacturing process control apparatus. Referring to FIG. 3, in the apparatus, the first determining module 101 is further configured to determine a current regulatory layer of the current product; and
the first obtaining module 102 is further configured to obtain historical measurement data within a specified period corresponding to the current regulatory layer.

An exemplary embodiment of the present disclosure provides a semiconductor manufacturing process control apparatus. Referring to FIG. 3, in the apparatus, when it is determined that the historical measurement data does not include the first measurement data of the current product lot, if it is determined, based on the preset configuration information, that the historical measurement data does not include the second measurement data of the target product lot, the control module 103 is further configured to prohibit processing of the current regulatory layer of the current product.

An exemplary embodiment of the present disclosure provides a semiconductor manufacturing process control apparatus. Referring to FIG. 3, in the apparatus, the priority of each the reference product lot in the at least one product lot is determined by the following modules:

a second obtaining module 202, configured to obtain historical regulatory data of the current regulatory layer; and
a second determining module 201, configured to determine the priority of each the reference product lot in the at least one product lot based on a regulatory data volume of each the reference product lot in the at least one product lot in the historical regulatory data.

An exemplary embodiment of the present disclosure provides a semiconductor manufacturing process control apparatus. As shown in FIG. 3, in the apparatus, the historical regulatory data includes multiple first sub-regulatory data of the current product lot and multiple second sub-regulatory data of each the reference product lot in the at least one product lot.

The second determining module 201 is further configured to determine, in a specified manner based on the multiple first sub-regulatory data and the multiple second sub-regulatory data, offset data corresponding to each the reference product lot in the at least one product lot.

An exemplary embodiment of the present disclosure provides a semiconductor manufacturing process control apparatus. As shown in FIG. 3, in the apparatus, the multiple first sub-regulatory data are first sub-regulatory data corresponding to multiple sensor life cycles within a specified life cycle range, the multiple second sub-regulatory data are second sub-regulatory data corresponding to the multiple sensor life cycles, and the multiple first sub-regulatory data, the multiple second sub-regulatory data, and the multiple sensor life cycles are in a one-to-one correspondence.

The second determining module 201 is further configured to:
determine sub-offset data corresponding to each of the multiple sensor life cycles, where the sub-offset data represents a conversion relationship between first sub-regulatory data and second sub-regulatory data corresponding to the sensor life cycle; and
determine a mode in multiple sub-offset data corresponding to the multiple sensor life cycles as the offset data corresponding to each the reference product lot in the at least one product lot.

Figure 4:
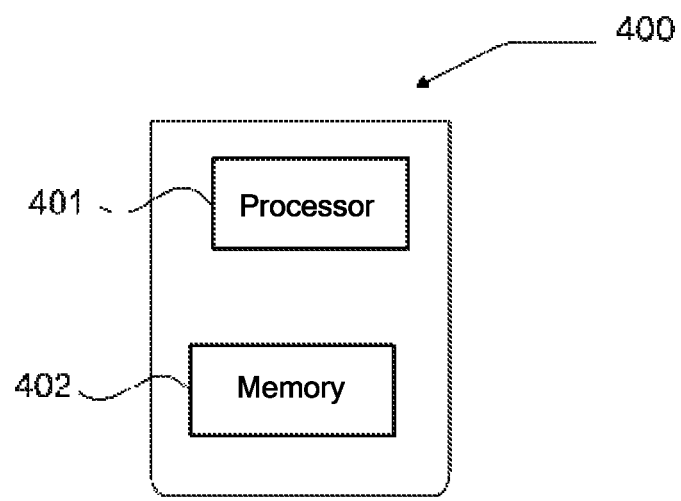
FIG. 4 is a block diagram of a semiconductor production device according to an exemplary embodiment.

An exemplary embodiment of the present disclosure provides a semiconductor production device. Referring to FIG. 4, the semiconductor production device 400 may be provided as a terminal device. The semiconductor production device 400 may include a processor 401, and one or more processors may be set as required. The semiconductor production device 400 may further include a memory 402 configured to store an executable instruction, such as an application program, of the processor 401. One or more memories may be set as required. The memory may store one or more application programs. The processor 401 is configured to execute the instruction to perform the foregoing method.

Persons skilled in the art should understand that the embodiments of the present disclosure may be provided as a method, an apparatus (device), or a computer program product. Therefore, the present disclosure may use a form of hardware only examples, software only examples, or examples with a combination of software and hardware. Moreover, the present disclosure may be in a form of a computer program product that is implemented on one or more computer-usable storage media that include computer-usable program code. The computer storage media include volatile and non-volatile, removable and non-removable media implemented in any method or technology for storing information (such as computer-readable instructions, data structures, program modules, or other data), including but not limited to, a RAM, a ROM, an EEPROM, a flash memory or other storage technologies, a CD-ROM, a digital versatile disk (DVD) or other optical disc storage, a magnetic cassette, a magnetic tape, magnetic disk storage or other magnetic storage apparatuses, or any other medium that can be used to store desired information and can be accessed by a computer. In addition, as is well known to persons of ordinary skill in the art, the communication media usually contain computer-readable instructions, data structures, program modules, or other data in modulated data signals such as carrier waves or other transmission mechanisms, and may include any information transfer medium.

In an exemplary embodiment, a non-transitory computer-readable storage medium including instructions is provided. Referring to FIG. 4, for example, the non-transitory computer-readable storage medium may be the memory 402 including instructions. The foregoing instructions may be executed by the processor 401 of the semiconductor production device 400 to complete the foregoing method. For example, the non-transitory computer-readable storage medium may be a ROM, a RAM, a CD-ROM, a magnetic tape, a floppy disk, an optical data storage device, or the like.

For example, when executed by a processor of a semiconductor production device, an instruction in the non-transitory computer-readable storage medium enables the semiconductor production device to perform the following steps:

analyzing wafer lot information and determining a current product lot of a current product;
obtaining historical measurement data within a specified period;
when determining that the historical measurement data does not include first measurement data of the current product lot, if determining, based on preset configuration information, that the historical measurement data includes second measurement data of a target product lot, determining target regulatory data based on the preset configuration information and the second measurement data; and
controlling a production parameter of the current product based on the target regulatory data.

The present disclosure is described with reference to the flowcharts and/or block diagrams of the method, the apparatus (device), and the computer program product according to the embodiments of the present disclosure. It should be understood that computer program instructions may be used to implement each process and/or each block in the flowcharts and/or the block diagrams and a combination of a process and/or a block in the flowcharts and/or the block diagrams. These computer program instructions may be provided for a general-purpose computer, a dedicated computer, an embedded processor, or a processor of any other programmable data processing device to generate a machine, such that the instructions executed by a computer or a processor of any other programmable data processing device generate an apparatus for implementing a specific function in one or more processes in the flowcharts and/or in one or more blocks in the block diagrams.

These computer program instructions may also be stored in a computer readable memory that can instruct the computer or any other programmable data processing device to work in a specific manner, such that the instructions stored in the computer readable memory generate an artifact that includes an instruction apparatus. The instruction apparatus implements a specific function in one or more processes in the flowcharts and/or in one or more blocks in the block diagrams.

These computer program instructions may also be loaded onto a computer or another programmable data processing device, such that a series of operations and steps are performed on the computer or the another programmable device, thereby generating computer-implemented processing. Therefore, the instructions executed on the computer or the another programmable device provide steps for implementing a function specified in one or more processes in the flowcharts and/or in one or more blocks in the block diagrams.

In the present disclosure, the terms "include", "comprise", or any other variations thereof are intended to cover a non-exclusive inclusion, such that an article or a device including a series of elements not only includes those elements, but also includes other elements that are not explicitly listed, or also includes inherent elements of the article or the device. Without more restrictions, the elements defined by the statement "including a . . . " do not exclude the existence of other identical elements in the article or device including the elements.

Although some preferred embodiments of the present disclosure have been described, persons skilled in the art can make changes and modifications to these embodiments once they learn the basic inventive concept. Therefore, the appended claims are intended to be interpreted as including the preferred embodiments and all changes and modifications falling within the scope of the present disclosure.

Apparently, persons skilled in the art can make various changes and modifications to the present disclosure without departing from the spirit and scope of the present disclosure. In this way, if these changes and modifications to the present disclosure fall within the scope of the claims of the present disclosure and equivalent technologies thereof, the present disclosure is further intended to include these changes and modifications. Persons skilled in the art can make various changes and modifications to the present disclosure without departing from the spirit and scope of the present disclosure. In this way, if these changes and modifications to the present disclosure fall within the scope of the claims of the present disclosure and equivalent technologies thereof, the present disclosure is further intended to include these changes and modifications.

INDUSTRIAL APPLICABILITY

According to the semiconductor manufacturing process control method and apparatus, the device, and the storage medium provided in the embodiments of the present disclosure, in the semiconductor manufacturing process (such as R2R), when the historical measurement data does not include the first measurement data of the current product lot (that is, the historical measurement data does not include first measurement data of a product in the same product lot as the current product), the target regulatory data may be determined based on second measurement data of another product, and then the production parameter of the current product may be controlled based on the target regulatory data. In this way, the intelligence of the entire control method is improved, and production capacity can be improved to a certain extent.

The invention claimed is:
1. A semiconductor manufacturing process control method, comprising:

analyzing wafer lot information and determining a current product lot of a current product;

obtaining historical measurement data within a specified period;

when determining that the historical measurement data does not comprise first measurement data of the current product lot, if determining, based on preset configuration information, that the historical measurement data comprises second measurement data of a target product lot, determining a target regulatory data based on the preset configuration information and the second measurement data; and controlling production parameters of the current product based on the target regulatory data.

2. The method according to claim 1, wherein in the preset configuration information, the current product lot corresponds to at least one reference product lot; and the determining, based on the preset configuration information, that the historical measurement data comprises the second measurement data of the target product lot comprises:

sequentially searching for measurement data of reference product lot from the historical measurement data based on a priority of each the reference product lot in the at least one reference product lot; and determining a found measurement data of the reference product lot as the second measurement data of the target product lot.

3. The method according to claim 2, wherein when each the reference product lot in the at least one reference product lot corresponds to one offset data, the offset data represents a conversion relationship between a reference regulatory data of a corresponding reference product lot and the target regulatory data; and the determining the target regulatory data based on the preset configuration information and the second measurement data comprises:

determining the reference regulatory data based on the second measurement data;

determining the offset data corresponding to the target product lot in the preset configuration information as a target offset data; and determining the target regulatory data based on the target offset data and the reference regulatory data.

4. The method according to claim 2, wherein when each the reference product lot in the at least one reference product lot corresponds to at least one sensor life cycle range, and each sensor life cycle range corresponds to one offset data, the offset data represents a conversion relationship between reference regulatory data of a corresponding reference product lot and the target regulatory data; and the determining the target regulatory data based on the preset configuration information and the second measurement data comprises:

obtaining a current sensor life cycle of a sensor in a semiconductor production device;

determining a sensor life cycle range to which the current sensor life cycle belongs as a current life cycle range;

determining an offset data corresponding to the target product lot and the current life cycle range in the preset configuration information as a target offset data;

determining a reference regulatory data based on the second measurement data; and determining the target regulatory data based on the target offset data and the reference regulatory data.

5. The method according to claim 3, wherein the obtaining the historical measurement data within the specified period comprises:

determining a current regulatory layer of the current product; and obtaining the historical measurement data within the specified period corresponding to the current regulatory layer.

6. The method according to claim 5, when determining the historical measurement data does not comprise the first measurement data of the current product lot, the method further comprising:

prohibiting processing of the current regulatory layer of the current product if it is determined, based on the preset configuration information, that the historical measurement data does not comprise the second measurement data of the target product lot.

7. The method according to claim 5, wherein the priority of each the reference product lot in the at least one reference product lot is determined comprising:

obtaining historical regulatory data of the current regulatory layer; and determining the priority of each the reference product lot in the at least one reference product lot based on a regulatory data volume of each the reference product lot in the at least one reference product lot in the historical regulatory data.

8. The method according to claim 7, the historical regulatory data comprising multiple first sub-regulatory data of the current product lot and multiple second sub-regulatory data of each the reference product lot in the at least one reference product lot; and the method further comprising:

determining the offset data corresponding to each the reference product lot in the at least one reference product lot in a specified manner, based on the multiple first sub-regulatory data and the multiple second sub-regulatory data.

9. The method according to claim 8, wherein the multiple first sub-regulatory data are the first sub-regulatory data corresponding to multiple sensor life cycles within a specified life cycle range, the multiple second sub-regulatory data are the second sub-regulatory data corresponding to the multiple sensor life cycles, and the multiple first sub-regulatory data, the multiple second sub-regulatory data, and the multiple sensor life cycles are in a one-to-one correspondence; and the determining the offset data corresponding to each the reference product lot in the at least one reference product lot in a specified manner, based on the multiple first sub-regulatory data and the multiple second sub-regulatory data, comprising:

determining a sub-offset data corresponding to each sensor life cycles in the multiple sensor life cycles, wherein the sub-offset data represents a conversion relationship between the first sub-regulatory data and the second sub-regulatory data corresponding to the sensor life cycle; and determining a mode in multiple sub-offset data corresponding to the multiple sensor life cycles as the offset data corresponding to each the reference product lot in the at least one reference product lot.

10. A semiconductor manufacturing process control apparatus, comprising:

one or more processors; and a storage apparatus, configured to store one or more programs, wherein the one or more programs, when executed by the one or more processors, cause the one or more processors to execute operations of:

analyzing wafer lot information and determine a current product lot of a current product;

obtaining historical measurement data within a specified period, wherein when determining that the historical measurement data does not comprise first measurement data of the current product lot, if determining, based on preset configuration information, that the historical measurement data comprises second measurement data of a target product lot, determine a target regulatory data based on the preset configuration information and the second measurement data; and controlling production parameters of the current product based on the target regulatory data.

11. The apparatus according to claim 10, in the preset configuration information, the current product lot corresponding to at least one reference product lot; and the one or more programs cause the one or more processors to execute operations of:

sequentially searching for measurement data of reference product lot from the historical measurement data based on a priority of each the reference product lot in the at least one reference product lot; and determining a found measurement data of the reference product lot as the second measurement data of the target product lot.

12. The apparatus according to claim 11, wherein when each the reference product lot in the at least one reference product lot corresponds to one offset data, the offset data represents a conversion relationship between a reference regulatory data of a corresponding reference product lot and the target regulatory data; and the one or more programs cause the one or more processors to execute operations of:

determining the reference regulatory data based on the second measurement data; and determining the offset data corresponding to the target product lot in the preset configuration information as a target offset data; and determining the target regulatory data based on the target offset data and the reference regulatory data.

13. The apparatus according to claim 11, wherein when each the reference product lot in the at least one reference product lot corresponds to at least one sensor life cycle range, and each sensor life cycle range corresponds to one offset data, the offset data represents a conversion relationship between reference regulatory data of a corresponding reference product lot and the target regulatory data; the one or more programs cause the one or more processors to execute operations of:

obtaining a current sensor life cycle of a sensor in a semiconductor production device; and determining a sensor life cycle range to which the current sensor life cycle belongs as a current life cycle range;

determining an offset data corresponding to the target product lot and the current life cycle range in the preset configuration information as a target offset data;

determining a reference regulatory data based on the second measurement data; and determining the target regulatory data based on the target offset data and the reference regulatory data.

14. The apparatus according to claim 12, the one or more programs cause the one or more processors to execute operations of:

determining a current regulatory layer of the current product; and obtaining the historical measurement data within the specified period corresponding to the current regulatory layer.

15. The apparatus according to claim 14, wherein when determined the historical measurement data does not comprise first measurement data of current product lot, if it is determined, based on the preset configuration information, that the historical measurement data does not comprise second measurement data of target product lot, the one or more programs cause the one or more processors to execute operations of: prohibiting processing of the current regulatory layer of the current product.

16. The apparatus according to claim 14, wherein the priority of each the reference product lot in the at least one reference product lot, the one or more programs cause the one or more processors to execute operations of:

obtaining historical regulatory data of the current regulatory layer; and determining the priority of each the reference product lot in the at least one reference product lot based on a regulatory data volume of each the reference product lot in the at least one reference product lot in the historical regulatory data.

17. The apparatus according to claim 16, wherein the historical regulatory data comprises multiple first sub-regulatory data of the current product lot and multiple second sub-regulatory data of each the reference product lot in the at least one reference product lot; and the one or more programs cause the one or more processors to execute operations of:

determining the offset data corresponding to each the reference product lot in the at least one reference product lot in a specified manner, based on the multiple first sub-regulatory data and the multiple second sub-regulatory data.

18. The apparatus according to claim 17, wherein the multiple first sub-regulatory data are the first sub-regulatory data corresponding to multiple sensor life cycles within a specified life cycle range, the multiple second sub-regulatory data are the second sub-regulatory data corresponding to the multiple sensor life cycles, and the multiple first sub-regulatory data, the multiple second sub-regulatory data, and the multiple sensor life cycles are in a one-to-one correspondence; and the one or more programs cause the one or more processors to execute operations of:

determining a sub-offset data corresponding to each of the multiple sensor life cycles in the multiple sensor life cycles, wherein the sub-offset data represents a conversion relationship between the first sub-regulatory data and the second sub-regulatory data corresponding to the sensor life cycle; and determining a mode in multiple sub-offset data corresponding to the multiple sensor life cycles as the offset data corresponding to each the reference product lot in the at least one reference product lot.

19. A non-transitory computer-readable storage medium, wherein when an instruction in the non-transitory computer-readable storage medium is executed by a processor of a device, the device is enabled to perform the method according to claim 1.

* * * * *